(12) United States Patent
Chen

(10) Patent No.: US 7,148,720 B2
(45) Date of Patent: Dec. 12, 2006

(54) IMPEDANCE MATCHING CIRCUIT AND METHOD

(75) Inventor: Yu-Kuo Chen, Taipei (TW)

(73) Assignee: Prolific Technology Inc., Taipei (TW)

( * ) Notice: Subject to any disclaimer, the term of this patent is extended or adjusted under 35 U.S.C. 154(b) by 0 days.

(21) Appl. No.: 10/904,926

(22) Filed: Dec. 6, 2004

(65) Prior Publication Data

US 2005/0146376 A1 Jul. 7, 2005

(30) Foreign Application Priority Data

Dec. 9, 2003 (TW) .............................. 92134654 A

(51) Int. Cl.
*H03K 17/16* (2006.01)
*H03K 19/03* (2006.01)
*H03K 19/0175* (2006.01)
*H03K 19/094* (2006.01)

(52) U.S. Cl. ............................. 326/30; 326/27; 326/34

(58) Field of Classification Search ............ 326/26–27, 326/30–34, 82–87
See application file for complete search history.

(56) References Cited

U.S. PATENT DOCUMENTS 6,064,224 A * 5/2000 Esch et al. ..................... 326/30
6,448,811 B1 * 9/2002 Narendra et al. ............. 326/30
6,525,558 B1 * 2/2003 Kim et al. ..................... 326/30
6,833,729 B1 * 12/2004 Kim et al. ..................... 326/30
6,937,055 B1 * 8/2005 Roy et al. ...................... 326/30

FOREIGN PATENT DOCUMENTS

TW 200306705 11/2003

* cited by examiner

*Primary Examiner*—James Cho
*Assistant Examiner*—Jason Crawford
(74) *Attorney, Agent, or Firm*—Jianq Chyun IP Office

(57) ABSTRACT

An impedance matching circuit has comparator, counter, two current sources, semiconductor resistance device, and variable MOS impedance device. The current sources are respectively coupled to an internal impedance device and an external impedance device. The comparator has two input terminals and an output terminal. The input terminals of the comparator are coupled to the internal and external impedance devices. The output terminal of the comparator is coupled to the counter. The variable MOS impedance device is coupled between the counter and the semiconductor impedance, and is controlled by the counter. When the voltages of the internal impedance and the external impedance are not matched, the variable MOS impedance device can provide the compensating impedance by adjusting the counting value of the counter.

12 Claims, 4 Drawing Sheets

IMPEDANCE MATCHING CIRCUIT AND METHOD

CROSS-REFERENCE TO RELATED APPLICATION

This application claims the priority benefit of Taiwan application serial no. 92134654, filed on Dec. 9, 2003.

BACKGROUND OF THE INVENTION

1. Field of the Invention

The present invention relates to a circuit, and more particularly to an impedance matching circuit and method.

2. Description of the Related Art

The speed of transmission is critical in digital data transmission. Therefore, the output impedance of the driver must match with the impedances of the external transmission line to reduce occurrence of signal distortion in digital data transmission in hardware of personal computer, such as display cards and memory device, or that in external transmitting devices, such as USB, RS 232 and IEEE.

In the prior art semiconductor circuit design, the materials serving for output impedance are usually made of polysilicon, diffused or well resistors and an external serial resistor. The resistance of the semiconductor resistors, however, are unstable and have ±30% accuracy variation roughly. As a result, the output impedance of the final circuit is usually different from what was desired. Therefore, the external serial resistor usually needs to be adjusted in order to compensate the variation of the semiconductor resistance so that the overall output impedance can fit requirement but after all, the variation of the output impedance always exists.

SUMMARY OF THE INVENTION

Accordingly, the present invention is directed to an impedance matching circuit, which automatically modifies the internal impedance to match the external desired impedance.

The present invention is also directed to an impedance matching circuit. The impedance modification can be done in the chip by using a simple circuit.

The present invention is directed to an impedance matching method, which precisely modifies the internal impedance to match the external desired impedance.

In order to achieve the objects described above, the present invention discloses an impedance matching circuit, which comprises a comparator, a counter, a semiconductor resistor, variable MOS impedance circuit and two current sources. The two current sources are respectively coupled to the internal and the external impedance devices. The internal impedance device comprises variable MOS impedance circuit and semiconductor resistor. The external impedance device is a desired resistor only. The comparator comprises two input terminals and one output terminal. One of the input terminal is coupled to the external impedance device and the other is coupled to the internal impedance device. The input of the counter is coupled to the output terminal of the comparator. The output of the counter is connected to the variable MOS impedance circuit of the internal impedance device. The variable MOS impedance circuit comprises several metal oxide semiconductor (MOS) transistors and switches controlled by the output of the counter. In addition, the present invention provides an impedance matching method. The method is a successive approximation of the zero difference between internal impedance and external desired impedance. It is by comparing the voltages generated by the two branches of the internal impedance and external impedance. The counting of the counter is started from the initial and stopped when the output of the comparator is exchanged. The final value of the internal impedance, which is controlled by the counting number, is approximated to the value of the external desired impedance.

The invention also provide a method for adjusting an internal impedance to match an external desired impedance form an external circuit with an internal impedance. The internal impedance includes a portion from an internal circuit. The method comprises coupling a variable semiconductor impedance device to the internal circuit, so as to add a variable impedance to the internal impedance. A first current and A second current are respectively applied to the external desired impedance and the internal impedance, so as to respectively apply a first voltage and a second voltage on the internal circuit and the eternal circuit. The first voltage and the second voltage are compared to produce a comparing result. Wherein, when the first voltage and the second voltage indicates a match between the internal impedance and the external desired impedance, then the method goes to a stop. Otherwise, according to a feed back of the comparing result, the variable impedance is adjusted to change the internal impedance and going to the step of comparing the first voltage and the second voltage.

The present invention utilizes a circuit, which automatically generates a compensation impedance therein. Therefore, upon the completion of the circuit, the output impedance matching the external impedance is generated accordingly without having to measure the internal impedance. As a result, the measurement errors can be avoided.

The above and other features of the present invention will be better understood from the following detailed description of the preferred embodiments of the invention that is provided in communication with the accompanying drawings.

DESCRIPTION OF SOME EMBODIMENTS

The present invention is characterized in designing the impedance matching circuit in the chip and using the voltage of external impedance device as a reference voltage. Accordingly, the impedance matching circuit automatically matches the impedance with the external impedance for various circuits.

Figure 1:
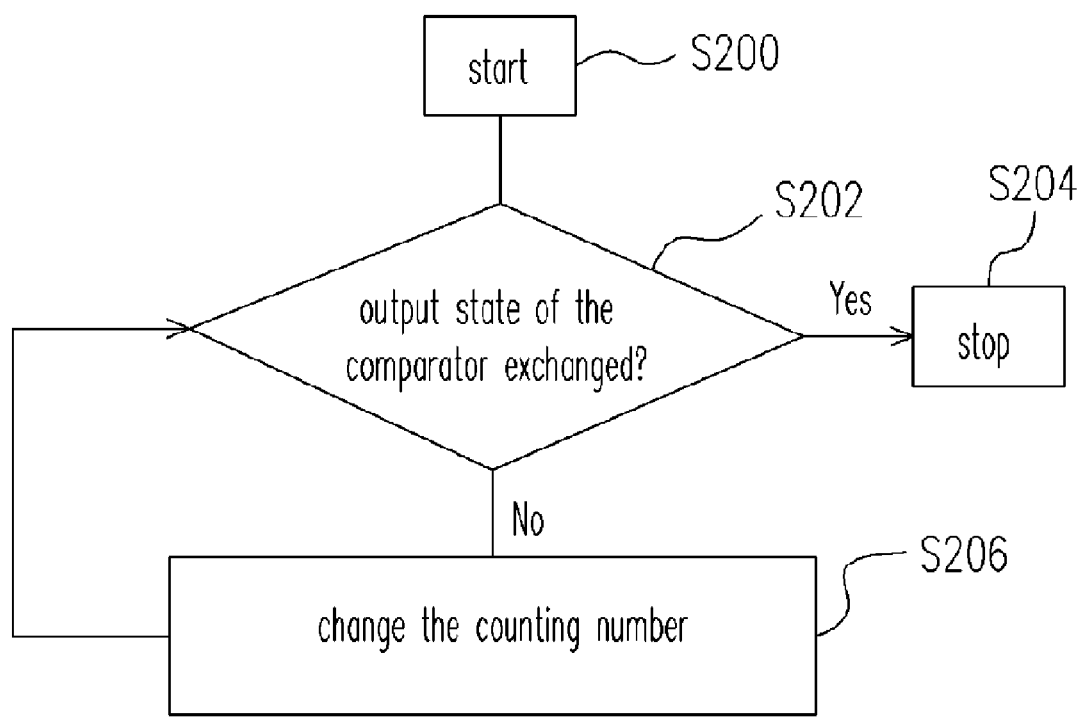
FIG. 1 is a flowchart showing an impedance matching method according to an embodiment of the present invention.
Figure 5:
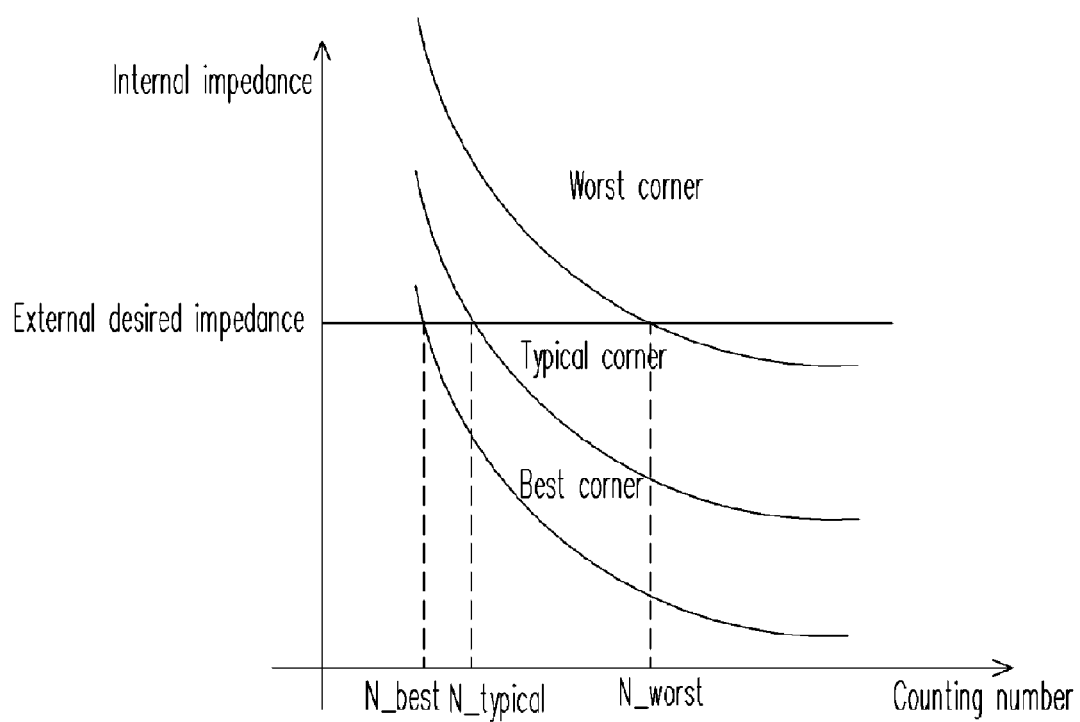
FIG. 5 has three curves showing a relationship between the internal impedance and the counting number at three corners in the impedance matching circuit according to an embodiment of the present invention.

FIG. 1 is a flowchart showing an impedance matching method according to an embodiment of the present invention. FIG. 5 has three curves showing a relationship between the internal impedance and the counting number at three corners in the impedance matching circuit according to an embodiment of the present invention. Referring to FIG. 1 and FIG. 5, in step S200, is starts, wherein a related initialization process has also been done. In step S202, a comparing state between the voltage drop of the internal impedance and an external desired impedance is output. If the voltage drops of the external and internal impedances are equal, it means that the external desired impedance matches with the internal impedance. The operation of impedance matching is completed and then goes to the step S204 for stop. Otherwise, the operation goes to the step S206 for change the counting value by generating a compensation impedance to compensate the internal impedance. The compensation impedance and the internal impedance constitute an output impedance. Then, the operation goes back to the step S202. At the end, the internal impedance can be adjusted to be substantially equal to the external desired impedance.

Figure 2:
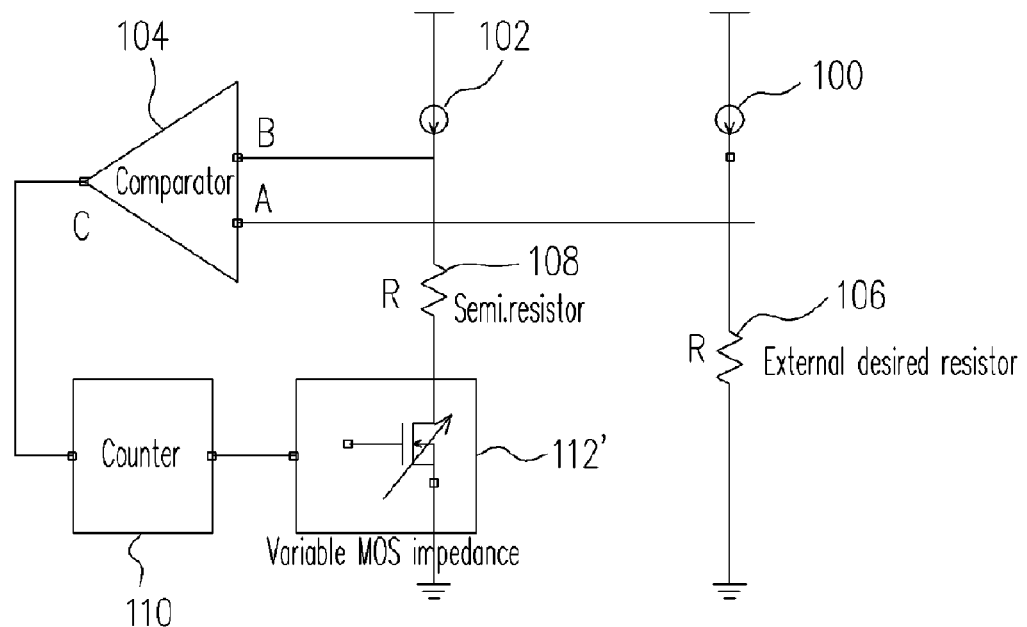
FIG. 2–4 are several schematic drawings showing an impedance compensating circuit according to an embodiment of the present invention.

FIG. 2 is a schematic drawing showing an impedance compensating circuit according to an embodiment of the present invention. The impedance matching circuit comprises current sources 100 and 102, a comparator 104, an external impedance device 106 such as an external desired resistor R, a semiconductor resistor R 108, a counter 110 and a variable MOS impedance circuit 112'. Herein, in general, the semiconductor resistor R 108 represents a total impedance from the internal circuit of an electronic device, which is to drive the external electronic device with the external desired impedance 106.

The comparator 104 comprises input terminals A and B, and an output terminal C. The current sources 100 and 102 provide currents required by the impedance compensating circuit. A terminal of the current source 100 is coupled to the one of the input terminals, such as the input terminal A of the comparator 104, and the current source 102 is coupled to the other one terminal B. However, the terminals A and B are just an example for easy descriptions. In addition, the current source 102 is also coupled with the semiconductor resistor 108, and the current source 100 is coupled with the external desired resistor 106. The semiconductor resistor 108 is further coupled with the variable impedance device 112', such as the variable MOS impedance. The counter 110 is coupled between the output terminal C of the comparator 104 and a control terminal of the n-type variable MOS impedance device 112'. By changing the counting value in the counter 110, the compensating resistance from the variable MOS impedance device 112' can be obtained. In other words, the n-type variable MOS impedance device 112' is, for example, shown in FIG. 3. The variable MOS impedance 112' can, for example, be formed by several MOS transistors, operated as the resistors. However, it is not the only limitation. By the control of the counter 110 according to the counting number, a portion or all of the MOS resistors can be selected to change the compensating resistance. The circuit shown in FIG. 2 can be properly integrated into a single chip or multiple chips.

Figure 3:
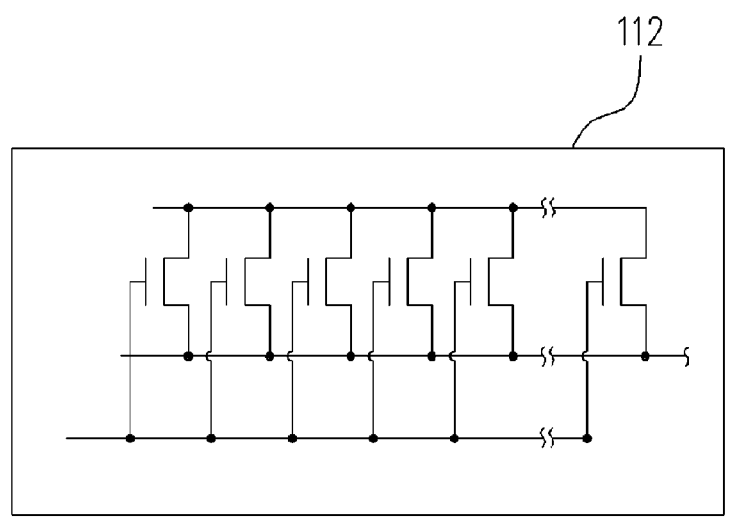
Figure 4:
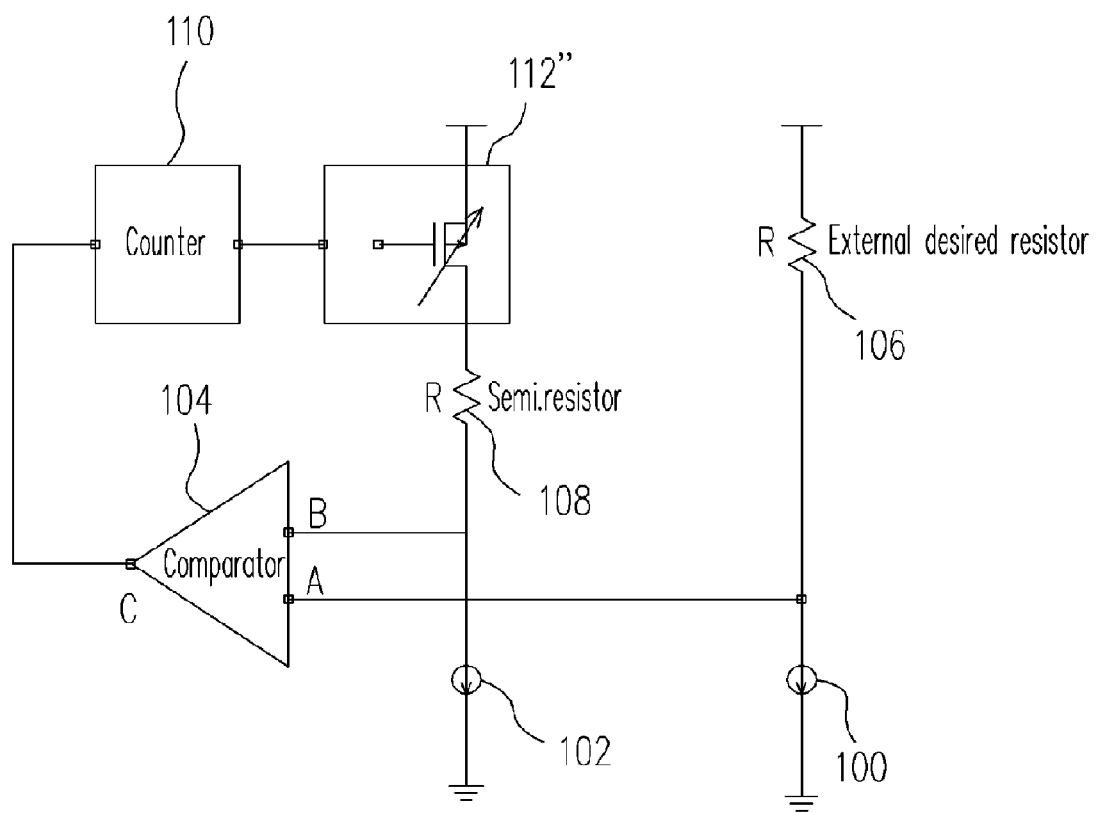

FIG. 4 is another circuit diagram, similar to the circuit structure of FIG. 3 but in p-type variable MOS impedance device 112". The difference in coupling structure is due to the different properties of the n-type MOS and p-type MOS in turning On/Off. For the p-type MOS design, terminals at one side of the current sources 100 and 102 are for example coupled to the ground. The p-type variable MOS impedance device 112" and the semiconductor resistor 108 are coupled in series between the ground voltage and the system voltage. The other terminal of the current source 102 is coupled to one of the input terminals of the comparator 104, indicated by B. Similarly, the other terminal of the current source 100 is coupled to another one of the input terminals of the comparator 104, indicated by A. Since the trigger voltage for the p-type MOS is a low trigger, the counter 110 produces the counting number in the voltage signal form, which satisfies the requirement of the p-type MOS to turn on/off.

Referring to FIG. 2 again, in the beginning of the impedance compensation, the current sources 100 and 102 provide currents $I_A$ and $I_B$ to the external desired resistor 106 and the internal impedance device 108, respectively, in order to generate a voltage $V_B$ at the input terminal B of the comparator 104 and a voltage $V_A$ at the input terminal A of the comparator 104. The initial counting value N of the counter 110 is at an initial value to produce an initial variable impedance. Therefore, the initial $V_B$ is $I_B \times R\_match$, wherein $R\_match$ is the sum of the impedance $R\_semi$ of the resistor 108 end the variable MOS impedance device 112'. The initial $V_A$ is $I_A \times R\_ext$, wherein $R\_ext$ represents the impedance of the external desired resistor 106 with for example ±1% variation. $R\_semi$ represents the impedance of the internal semiconductor resistor 108 with, for example, ±30% variation. In order to easy design, the current $I_A$ can be equal to current $I_B$, to produce the voltages $V_A$ and $V_B$ for easy comparison. However, current $I_A$ is not always necessary to be equal to current $I_B$. However, the counter 110 can have the capability to properly interpret the voltages $V_A$ and $V_B$.

After the voltages $V_B$ and $V_A$ are respectively applied to the input terminal B and the input terminal A of the comparator 104 and the computation of the internal circuit of the comparator 104, a voltage $V_C$ is output by the output terminal C, which is proportional to $(V_A-V_B)$ or $(V_B-V_A)$, depending on the actual design. Here, the quantities of $(V_A-V_B)$ is just an example of operation. Also referring to FIG. 5, if $V_C$ is positive, i.e. $V_A>V_B$, the counter 110 is activated to decrease the counting value N, which change the impedance of the variable MOS impedance device 112', so that the internal impedance can match to the external desired impedance. Likewise, if $V_C$ is negative, then it means $V_A<V_B$. The counting value N is then decreased.

In the variable semiconductor impedance circuit 112 (see FIG. 3), the number of the MOS transistors 114 coupled to the counter 110 is determined by the counting value N, and the MOS transistors 114 are connected in parallel. Therefore, the total impedance of the variable semiconductor impedance circuit 112 can be adjusted.

In FIG. 5, each of the three curves of the internal impedance, which is the sum of the impedance of the semiconductor resistor 108 and the variable MOS impedance device 112'. Since the variable MOS impedance device 112' is variable under control from the counter 110, the internal impedance is a function of the counting value N. The counter 110 generated the counting value according to the output from the comparator 104. The top curve represents, for example, a situation at the worst corner in the impedance matching circuit to be compensated. The bottom curve represents, for example, the situation at the best corner to be compensated. The middle curve represents the typical situation at the usual corner. No matter at which curve, the internal impedance can be adjusted to the external desired impedance by changing the counting value.

The impedance matching circuit of the present invention comprises a plurality of parallel MOS transistors, which are coupled to the polysilicon impedance device in series to output an output impedance. Through outputting the comparison signal from the comparator to the counter and modifying the number of the transistors in the counter, the output impedance is matched with the external impedance. Therefore, the present invention can automatically match the output impedance with the external impedance without having to measure the output impedance with instruments. Hence, measurement errors can be avoided.

The impedance matching circuit of the present invention uses the impedance of the biased circuit as a reference, so no additional circuit is required to provide such function.

The MOS transistors are designed in the circuit chip for providing impedance compensation. Therefore, few external devices are required, maximizing the size of the circuit chip.

Although the present invention has been described in terms of exemplary embodiments, it is not limited thereto. Rather, the appended claims should be constructed broadly to include other variants and embodiments of the invention, which may be made by those skilled in the field of this art without departing from the scope and range of equivalents of the invention.

What is claimed is:

1. An impedance matching circuit, comprising:
    a comparator comprising a first input terminal, a second input terminal and an output terminal, wherein the first input terminal is coupled to an external desired impedance device and the second input terminal is coupled to a semiconductor impedance device;
    a variable semiconductor impedance circuit coupled between the semiconductor impedance device and a voltage source;
    a counter coupled to the output terminal of the comparator and the variable semiconductor impedance device, for generating a counting value to control the variable semiconductor impedance device, wherein when the voltages at the first and the second input terminals of the comparator are substantially equal, then a stop operation is triggered; and
    a first and a second current sources coupled with the external desired impedance device and the semiconductor impedance device, respectively.

2. The impedance matching circuit of claim 1, wherein the variable semiconductor impedance circuit comprises a plurality of metal-oxide semiconductor (MOS) transistors, serving as MOS resistors under controlled by the counter.

3. The impedance matching circuit of claim 2, wherein the MOS transistors are n-type MOS transistors, and the voltage source is a ground.

4. The impedance matching circuit of claim 2, wherein the MOS transistors are p-type MOS transistors, and the voltage source is the system voltage.

5. The impedance matching circuit of claim 1, wherein the counter change the counting value according to an output of the comparator.

6. The impedance matching circuit of claim 1, wherein currents provided by the first and the second current sources are equal.

7. The impedance matching circuit, of claim 1, wherein the comparator, the counter, and the variable semiconductor impedance device are integrated into a single circuit chip.

8. A method for adjusting an internal impedance to match an external desired impedance form an external circuit with an internal impedance, wherein the internal impedance includes a portion from an internal circuit, the method comprising:
    coupling a variable semiconductor impedance device to the internal circuit, so as to add a variable impedance to the internal impedance;
    applying a first current and a second current respectively to the external desired impedance and the internal impedance, so as to respectively apply a first voltage and a second voltage on the internal circuit and the external circuit; and
    comparing the first voltage and the second voltage to produce a comparing result with a comparator comprising a first input terminal, a second input terminal and an output terminal, wherein the first input terminal is coupled to the external desired impedance device and the second input terminal is coupled to a semiconductor impedance device with a variable semiconductor impedance device coupled between the semiconductor impedance device and a voltage source,
    wherein when the first voltage and the second voltage indicates a match between the internal impedance and the external desired impedance, then going to a stop; otherwise, according to a feed back of the comparing result, adjusting the variable impedance to change the internal impedance and going to the step of comparing the first voltage and the second voltage.

9. The method of claim 8, wherein the first current is substantially equal to the second current.

10. The method claim 9, wherein when the first voltage is substantially equal to the second voltage, the method goes to the stop.

11. The method claim 8, wherein the variable semiconductor impedance device is a variable MOS impedance device.

12. The method claim 8, wherein the step of adjusting the variable impedance is by a counting number, according to the feed back of the comparing result.

* * * * *